US010854523B2

(12) United States Patent
Nishizawa et al.

(10) Patent No.: US 10,854,523 B2
(45) Date of Patent: Dec. 1, 2020

(54) SEMICONDUCTOR DEVICE

(71) Applicant: Mitsubishi Electric Corporation, Tokyo (JP)

(72) Inventors: Koichiro Nishizawa, Tokyo (JP); Yoshitsugu Yamamoto, Tokyo (JP); Katsumi Miyawaki, Tokyo (JP); Shinsuke Watanabe, Tokyo (JP); Toshihiko Shiga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/316,108

(22) PCT Filed: Oct. 24, 2016

(86) PCT No.: PCT/JP2016/081393
§ 371 (c)(1),
(2) Date: Jan. 8, 2019

(87) PCT Pub. No.: WO2018/078680
PCT Pub. Date: May 3, 2018

(65) Prior Publication Data
US 2020/0185285 A1    Jun. 11, 2020

(51) Int. Cl.
*H01L 23/02* (2006.01)
*H01L 23/04* (2006.01)
(Continued)

(52) U.S. Cl.
CPC ........ *H01L 23/041* (2013.01); *H01L 21/4817* (2013.01); *H01L 23/10* (2013.01); *H01L 23/345* (2013.01); *H01L 23/552* (2013.01)

(58) Field of Classification Search
CPC . H01L 23/10; H01L 31/0203; H01L 21/4803; H01L 23/053; H01L 23/055;
(Continued)

(56) References Cited

U.S. PATENT DOCUMENTS 5,021,663 A * 6/1991 Hornbeck ............... G01J 5/02
250/338.1
2012/0235038 A1 9/2012 Nishikawa et al.
(Continued)

FOREIGN PATENT DOCUMENTS

CN      107924881 A    4/2018
JP      H01-145133 U   10/1989
(Continued)

OTHER PUBLICATIONS

International Search Report; Written Opinion; and Notification of Transmittal of the International Search Report and the Written Opinion of the International Searching Authority, or the Declaration issued in PCT/JP2016/081393; dated Dec. 27, 2016.
(Continued)

*Primary Examiner* — Theresa T Doan
(74) *Attorney, Agent, or Firm* — Studebaker & Brackett PC

(57) ABSTRACT

A semiconductor device according to the present invention includes: a substrate; a heat generating portion provided on the substrate; a cap substrate provided above the substrate so that a hollow portion is provided between the substrate and the cap substrate; and a reflection film provided above the heat generating portion and reflecting a medium wavelength infrared ray. The reflection film reflects the infrared ray radiated to the cap substrate side through the hollow portion due to the temperature increase of the heat generating portion, so that the temperature increase of the cap substrate side can be suppressed. Because of this function, even if mold resin is provided on the cap substrate, increase of the temperature of the mold resin can be suppressed.

16 Claims, 9 Drawing Sheets

(51) Int. Cl.
*H01L 21/48* (2006.01)
*H01L 23/10* (2006.01)
*H01L 23/34* (2006.01)
*H01L 23/552* (2006.01)

(58) Field of Classification Search
CPC ............... H01L 23/3121; H01L 23/481; H01L 23/49562; H01L 23/49822; H01L 23/576; H01L 21/4857; H01L 23/28; H01L 23/49833; H01L 23/5389; H01L 23/585
USPC ........................................................ 257/678
See application file for complete search history.

(56) References Cited

U.S. PATENT DOCUMENTS

2012/0322206 A1   12/2012   Tabrizi
2018/0138132 A1   5/2018    Nishizawa et al.
2018/0151404 A1*  5/2018    Francis ............. H01L 21/02658

FOREIGN PATENT DOCUMENTS

JP   2006-237405 A   9/2006
JP   2011-018671 A   1/2011
TW   201129790 A1    9/2011

OTHER PUBLICATIONS

Office Action corresponding to Taiwanese Patent Application No. 106116432; mailed by the Taiwanese Patent Office dated Mar. 20, 2018.

An Office Action mailed by the Korean Patent Office dated Jun. 28, 2020, which corresponds to Korean Patent Application 10-2019-7011108 and is related to U.S. Appl. No. 16/316,108 with English language translation.

An Office Action mailed by the German Patent Office dated Jul. 9, 2020, which corresponds to German Patent Application No. 112016007369.0 and is related to U.S. Appl. No. 16/316,108 with English language translation.

* cited by examiner

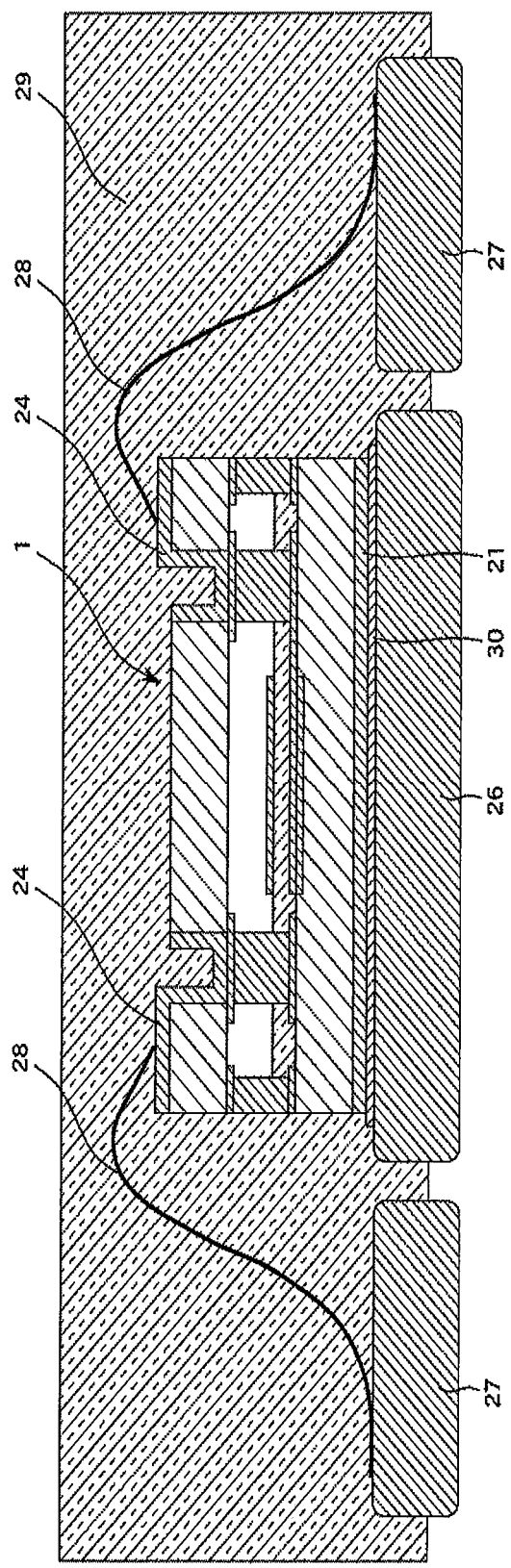

SEMICONDUCTOR DEVICE

FIELD

The present invention relates to a semiconductor device having a hollow portion.

BACKGROUND

A plastic package for sealing with mold resin is used as a package incorporating a semiconductor chip therein. The plastic package has an advantage that it is more inexpensive as compared with a ceramic package for sealing with ceramics. However, since the mold resin has a lower heat resisting temperature than the ceramics, the temperature of the mold resin in contact With a semiconductor chip may rise up to a temperature near to the heat resisting temperature or more due to heat generated from a heat generating portion in the semiconductor chip. As a result, there has been a problem that the mold resin is carbonized and peeled off from an interface with the semiconductor chip or the like.

In order to suppress increase in the temperature of the mold resin, it is effective to use a sealing structure having a hollow portion exemplified in PTL 1 to PTL 3. This is because the hollow portion thermally insulates the heat generating portion of the semiconductor chip and the mold resin from each other.

CITATION LIST

Patent Literature

[PTL 1] JP H01-145133 U
[PTL 2] JP 2006-237405 A
[PTL 3] JP 2011-18671 A

SUMMARY

Technical Problem

However, when the amount of heat generated from the semiconductor chip is large, there is a problem that even by using the sealing structure having the hollow portion, infrared rays radiated from the heat generating portion are absorbed by the mold resin through the hollow portion, so that the temperature of the mold resin increases. Therefore, for high-output semiconductor devices, etc. which generate a large amount of heat, the plastic package using the mold resin cannot be used, and thus the ceramic package having the hollow portion must be used in some cases. Therefore, the package price increases as compared with the plastic package.

The present invention has been made to solve the above-mentioned problems, and has an object to provide a semiconductor device in which increase in temperature of mold resin is suppressed.

Solution to Problem

A semiconductor device according to the present invention includes: a substrate; a heat generating portion provided on the substrate; a cap substrate provided above the substrate so that a hollow portion is provided between the substrate and the cap substrate; and a reflection film provided above the heat generating portion and reflecting a medium wavelength infrared ray.

Advantageous Effects of Invention

The present invention makes it possible to suppress increase in temperature of mold resin in a semiconductor device having a hollow portion.

BRIEF DESCRIPTION OF THE DRAWINGS

FIG. 5 is a cross-sectional view showing a state where a semiconductor device according to a first embodiment is packaged.

DESCRIPTION OF EMBODIMENTS

First Embodiment

[Configuration]

Figure 1:
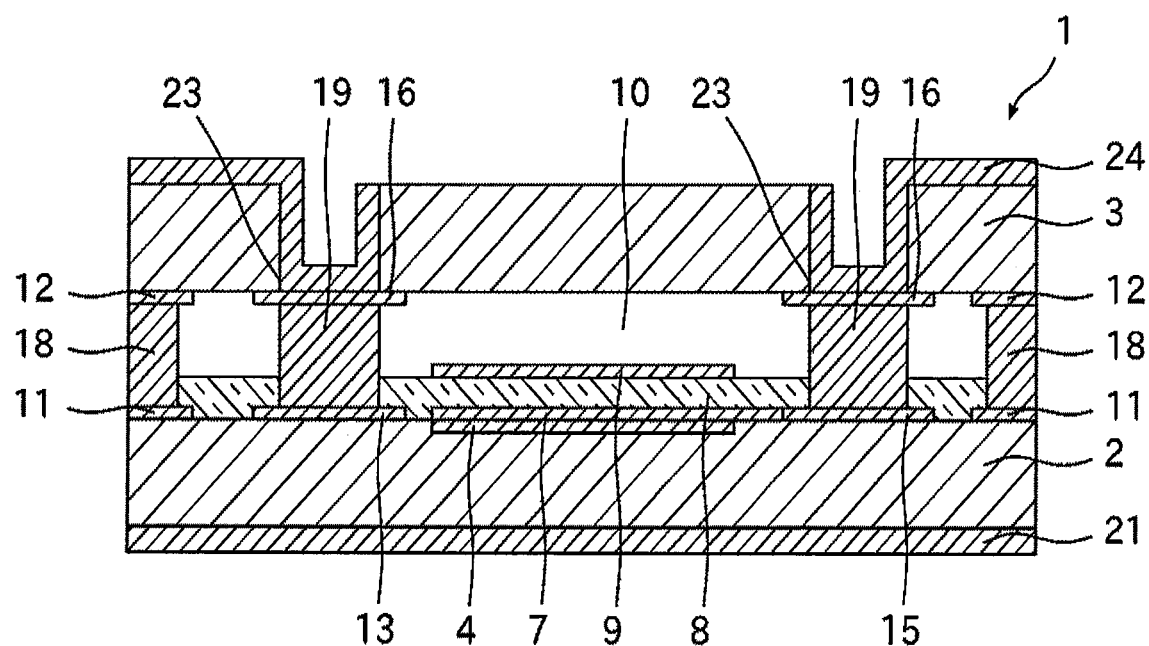
FIG. 1 is a cross-sectional view showing a semiconductor device according to a first embodiment.
Figure 2:
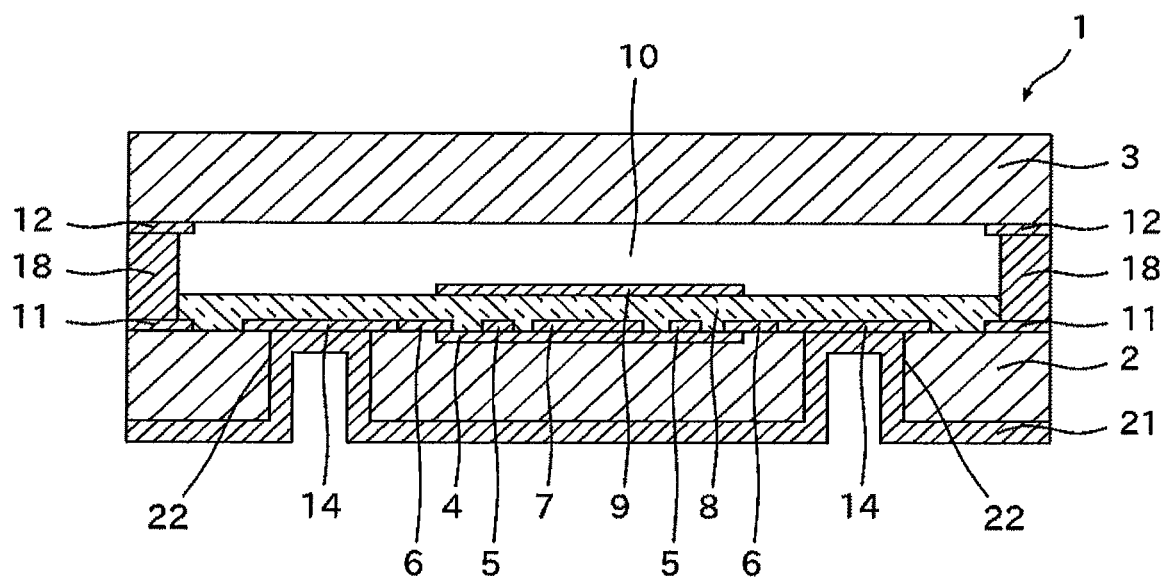
FIG. 2 is a cross-sectional view showing a semiconductor device according to a first embodiment.
Figure 3:
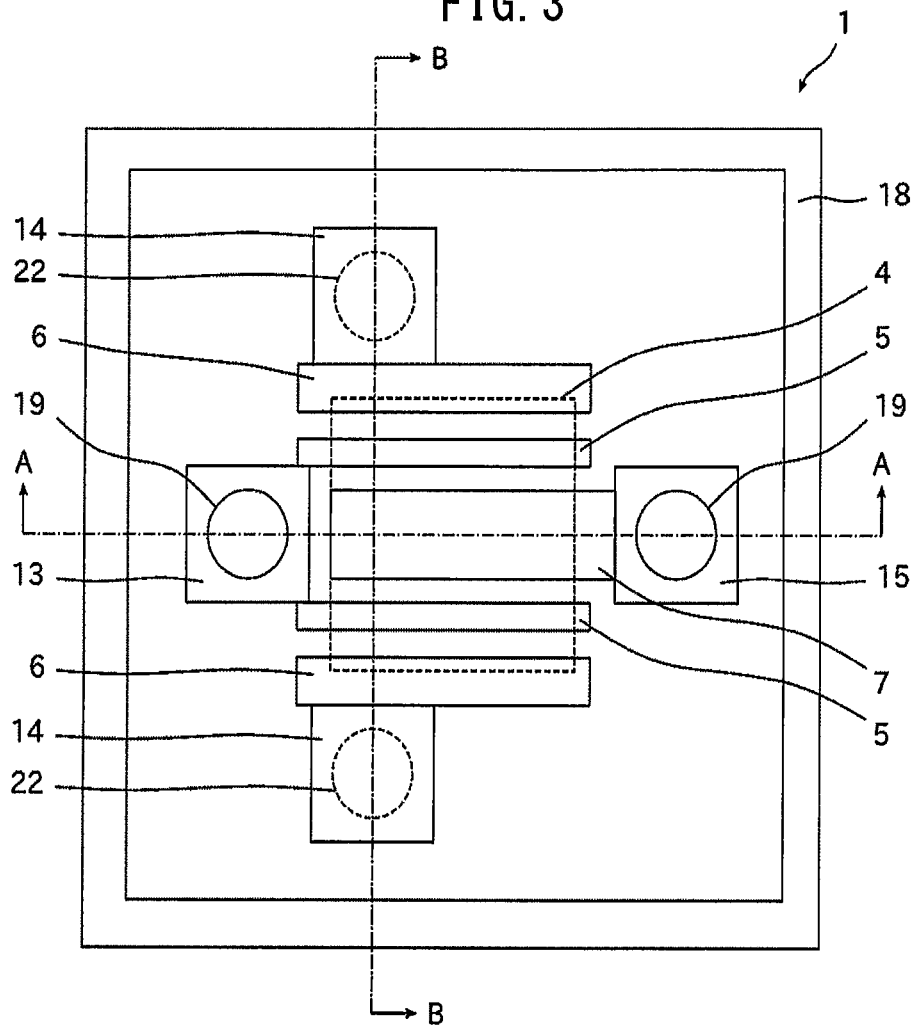
FIG. 3 is a top view showing a semiconductor device according to a first embodiment.

The configuration of a semiconductor device 1 according to a first embodiment will be described. FIGS. 1 and 2 are cross-sectional views of the semiconductor device 1 for A-A cross-section and B-B cross-section in FIG. 3, respectively. FIG. 3 is a top view of the semiconductor device 1. In FIG. 3, however, a cap substrate 3, a reflection film 9 and the like are omitted from the illustration.

As shown in FIGS. 1 and 2, a heat generating portion 4 is formed on a substrate 2. The material of the substrate 2 is SiC, and the thickness of the substrate 2 is equal to about 100 µm. Although not shown, HEMT (High Electron Mobility Transistor) as an active element is formed on an upper surface of the mirror-finished substrate 2 by using an epitaxially-grown GaN layer or AlGaN layer, and a channel is formed at the interface between the GaN layer and the AlGaN layer. In this case, the heat generating portion 4 is this channel. A gate electrode 5, a source electrode 6, and a drain electrode 7 are formed in the HEMT, and are electrically connected to electrode pads 13 to 15, respectively. The lengths of these electrodes are equal to about 50 to 100 μm, the width of the gate electrode 5 is equal to about 1 to 5 μm per electrode, and the widths of both the source electrode 6 and the drain electrode 7 are equal to about 10 to 50 μm.

A case where only one HEMT is included in the semiconductor device is shown here, but two or more HEMTs may be included. Further, the substrate 2 is not necessarily the SiC substrate, and may be a substrate of GaAs, Si, SiGe, GaN, InP or the like. In addition, the active element may be a MOSFET (Metal Oxide Semiconductor Field Effect Transistor), an HFET (Heterostructure Field Effect Transistor), a bipolar transistor, or the like. Further, passive elements such as a resistor, a capacitor, an inductor, etc. may be included, and these passive elements and the active element may constitute an electric circuit.

Vias 22 are formed in the substrate 2. The via 22 is electrically connected to a source electrode pad 14 and a back surface electrode 21. A bonding pad 11 is provided on the substrate 2 so as to surround the heat generating portion 4, and a sealing frame 18 is provided on the bonding pad 11. Further, bumps 19 are provided on the gate electrode pad 13 and the drain electrode pad 15.

An insulating film 8 is formed on the substrate 2 so as to cover the heat generating portion 4. Here, the insulating film 8 is formed in an entire region excluding the bumps 19 and the sealing frame 18.

A reflection film 9 is provided on the insulating film 8. In plan view, the reflection film 9 is formed in a region narrower than that of the insulating film 8. The reflection film 8 has a property of reflecting infrared rays and is arranged so as to substantially overlap the heat generating portion 4 in plan view.

A cap substrate 3 is provided in such a manner as to be supported by the sealing frame 18 and the bumps 19. The material of the cap substrate 3 is Si, and the thickness of the cap substrate 3 is equal to about 100 μm. Vias 23 are formed in the cap substrate 3. The gate electrode 5 and the drain electrode 7 are led out via the bumps 19 and the electrode pads 16 to electrodes 24 provided on the upper surface of the cap substrate 3. A hollow portion 10 is provided between the substrate 2 and the cap substrate 3, and the height of the hollow portion 10 is equal to about 10 μm. The hollow portion 10 is surrounded by the insulating film 8, the sealing frame 18, and the cap substrate 3 to be kept airtight.

Figure 4:
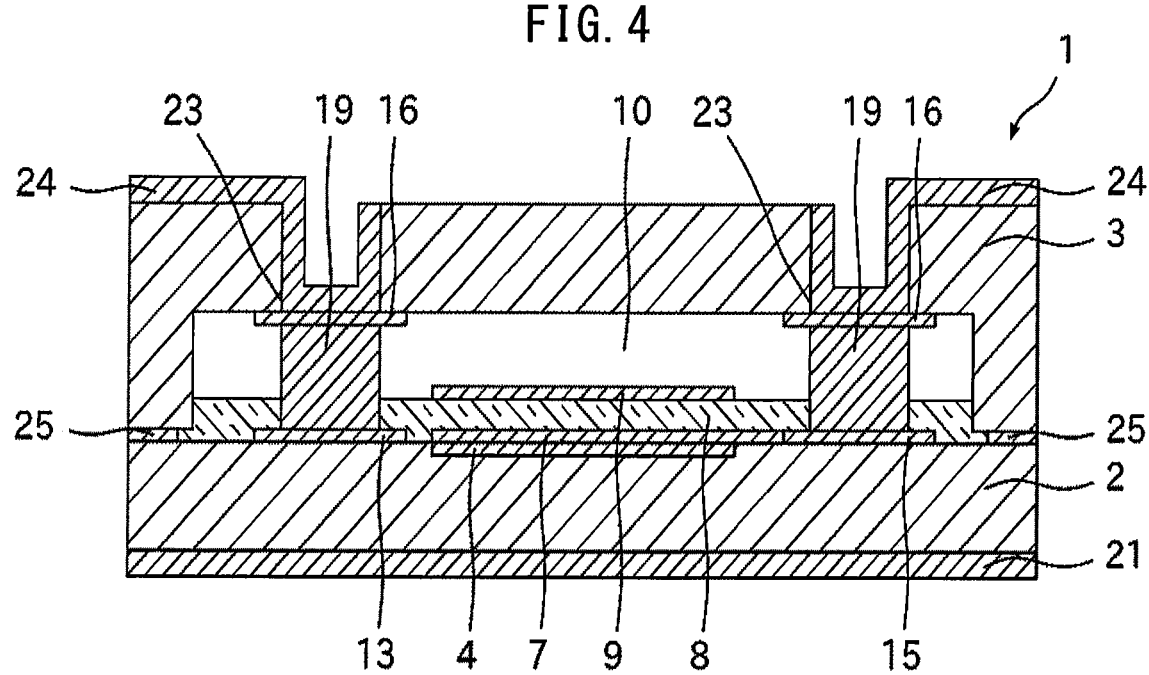
FIG. 4 is a cross-sectional view showing a modified example of a semiconductor device according to a first embodiment.

In the semiconductor device 1 of the first embodiment, the entire lower surface of the cap substrate 3 is flat. However, when the height of the sealing frame 18 cannot be sufficiently secured, the cap substrate 3 may be configured in a concave shape to secure the hollow portion 10 as shown in FIG. 4. In this case, the cap substrate 3 is placed on the sealing material 25 provided on the substrate 2, and the sealing material 25 is made of resin.

Although the cap substrate 3 is formed so as to cover the entire surface of the substrate 2 in the semiconductor device 1 of the first embodiment, the cap substrate 3 is not necessarily required to cover the entire surface, and it may be structured to have the sealed hollow portion 10 above the heat generating portion 4.

Further, elements other than wirings may be formed on the cap substrate 3, and for example, a matching circuit for an electric circuit including the HEMT formed on the substrate 2 may be formed. In addition, a semiconductor substrate having an epitaxial growth surface may be used as the material of the cap substrate 3, and active elements such as a transistor, etc. and an epitaxial resistor may be formed on the cap substrate 3 to constitute an electrical circuit by using these elements.

Next, a configuration in which the semiconductor device 1 is packaged will be described. FIG. 5 is a cross-sectional view showing a state where the semiconductor device 1 is packaged. A base 26 is bonded to the bottom of the back surface electrode 21 via a die-bonding material 30 such as AuSn solder or the like. The base 26 is used to electrically connect the source electrode 6 to the outside. Since the base 26 also serves as a heat dissipation material, a member having an excellent heat dissipation characteristic is suitable, and for example, CuW is used as the material of the member. Further, in order to electrically connect the drain electrode 7 and the source electrode 6 to the outside, leads 27 are electrically connected via wires 28 to the electrodes 24 formed on the upper surface of the cap substrate 3.

Mold resin 29 sealing the semiconductor device 1 is formed around the semiconductor device 1. The semiconductor device 1 is sealed by the mold resin 29, whereby the semiconductor device 1 is protected from the outside.

Here, a case of a semiconductor device which is supposed to generate heat of about 100 W will be described. FIG. 3 shows a case where two gate electrodes 5 are provided. In the case of a semiconductor device in which heat generation of about 100 W is assumed, the length of the gate electrodes is equal to about 500 μm, the number of gate electrodes is equal to about 50 to 100. In this case, the width of HEMT is equal to 2 to 4 mm.

When there is heat generation of about 100 W as described above, the temperature of the heat generating portion may be about 100 to 300° C. in some cases. According to Wien's displacement law, the peak wavelength λ (μm) of blackbody radiation is given by the following equation with T as temperature (° C.).

$$\lambda = 2896/(T+273)$$

Assuming that the peak wavelength of radiation from the heat generating portion 4 approximately satisfies this formula, the peak wavelength ranges from 5.1 to 7.8 μm in the case of the temperature ranging from 100 to 300° C. Wavelengths in this range are classified as medium wavelength infrared rays (3 to 8 μm).

[Manufacturing Method]

A method of manufacturing the semiconductor device 1 according to the first embodiment and a method of sealing the semiconductor device 1 with mold resin will be described.

Figure 6A:
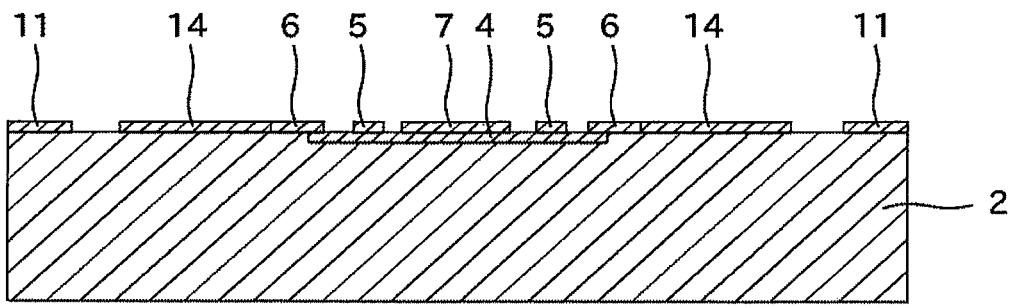
FIG. 6 is a cross-sectional view showing a step of processing a substrate used for a semiconductor device according to a first embodiment.

The processing for the substrate 2 will be described along FIG. 6. FIG. 6 is a B-B cross-sectional view of FIG. 3. It is assumed that the GaN layer or the AlGaN layer has already been laminated on the substrate 2 although not shown. First, as shown in FIG. 6A, the gate electrode 5, the source electrode 6, the drain electrode 7, the bonding pads 11, and the electrode pads 13 to 15 are formed on the upper surface of the substrate 2. However, since the electrode pads 13 and 15 do not appear on the cross-section in FIG. 2, these electrode pads are not shown. The bonding pads 11 and the electrode pads 13 to 15 are formed as a countermeasure to a case where the sealing frame 18 and the bumps 19 have poor adhesiveness to the substrate 2 or are formed of materials which are diffused into the substrate 2. For example, when the materials of the sealing frame 18 and the bumps 19 are Au, it is good to form the contact surface with these materials of Au. Therefore, after resist patterning, Ti and Au are sequentially formed by vapor deposition, and then a pattern is formed by lift-off. As for the configuration of the metals, for example, it is assumed that Ti is formed by 50 nm and then Au is formed by 500 nm. Ti is used to ensure adhesiveness and barrier property to the cap substrate 3, and Au is used to ensure adhesiveness to the sealing frame 18 and the bumps 19. Since the description will be made hereinto with respect to a case where Au or AuSn is used as the materials of the sealing frame 18 and the bumps 19, the surfaces of the bonding pads 12 and the electrode pads 16 are also made of Au. However, when other metals are used as the materials of the sealing frame 18 and the bumps 19, it is necessary to select metal materials on the outermost surfaces of the bonding pads 11 and the electrode pads 13 to 15 according to the other metals.

Figure 6B:
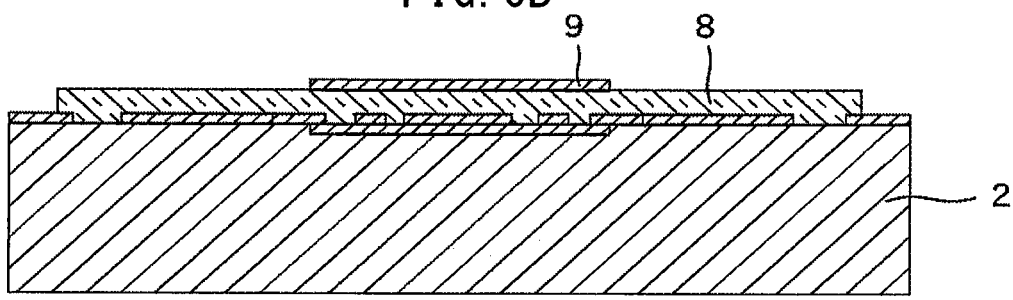

Next, as shown in FIG. 6B, the insulating film 8 and the reflection film 9 are formed. In order to form the insulating film 8, a photosensitive polyimide material is first coated on the entire surface of a wafer, exposure and development are carried out with a photomask, and openings are formed at the formation places of the sealing frame 18 and the bumps 19. Thereafter, when baking is performed at 200° C. to 300° C. for about 1 hour in a nitrogen atmosphere, the solvent of the polyimide material is removed, and at the same time, imidization is carried out by a crosslinking reaction, whereby the insulating film 8 is formed as a permanent film. Next, the reflection film 9 is formed above the heat generating portion 4 and on the insulating film. The reflection film 9 is formed by vapor deposition lift-off using Au as a material. Alternatively, it may be formed on the whole surface by a metal sputtering method, and then subjected to resist patterning, and then an unnecessary portion may be removed by an ion milling method or the like.

Figure 6C:
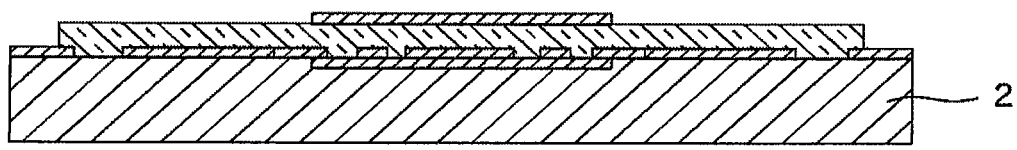

Next, the substrate 2 is thinned by grinding the back surface side of the substrate 2 as shown in FIG. 6C. After grinding the substrate 2, a damaged layer is removed by polishing. The thickness of the substrate 2 is set to, for example, about 100 μm.

Figure 6D:
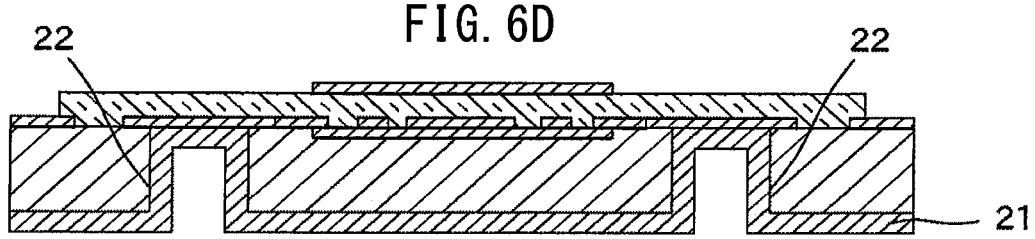

Next, the vias 22 and the back surface electrode 21 are formed as shown in FIG. 6D. Resist patterning is performed on the thinned surface of the substrate 2, and the vias 22 are formed by wet or dry etching. Then, the back surface electrode 21 is formed on the lower surface of the substrate 2. Since it is difficult to obtain a thick metal film in the via 22 by sputtering or vapor deposition, for example, films of Ti and Au are continuously formed by sputtering, and then Au of about several micrometers is further plated by electroplating. The patterning is carried out with a resist after the plating, and an unnecessary portion is removed by wet etching or milling.

Figure 6E:
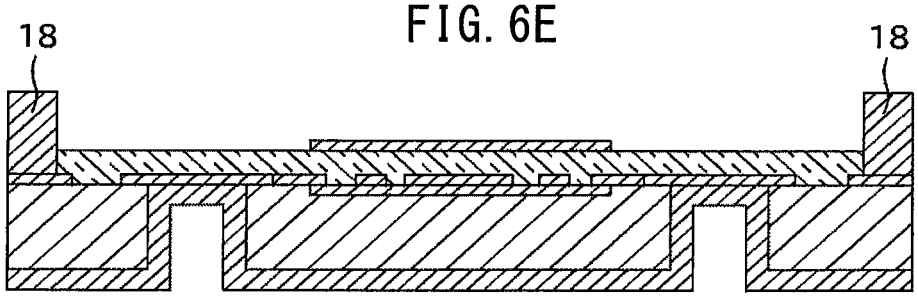

Next, as shown in FIG. 6E, the sealing frame 18 and the bumps 19 are simultaneously formed by using Au as the materials thereof. However, since the bumps 19 do not exist on the cross-section in FIG. 6E, the bumps 19 are not shown. After patterning is performed with a resist while excluding the portions of the sealing frame 18 and the bumps 19, Au having a thickness of 300 nm is formed as a seed layer by sputtering, and another one layer is further subjected to patterning with a resist while excluding the sealing frame 18 and the bumps 19, thereby exposing the seed layer of the sealing frame 18 and the bumps 19. Electrolytic Au plating is performed on an exposed portion to form the sealing frame 18 and the bumps 19 at the same height. Thereafter, when resist removal, milling, and resist removal are sequentially performed, the sealing frame 18 and the bumps 19 are completed. The sealing frame 18 and the bumps 19 may be formed separately from each other. In such a case, since the sealing frame 18 is not necessarily made of a conductive metal, it may be formed of an organic material such as polyimide or an inorganic material such as glass. Further, as the forming method, electroless plating may be used, or a material obtained by mixing a material such as metal particles with solvent may be patterned by a printing method or an inkjet method.

The processing on the substrate 2 is thus completed.

Figure 7A:
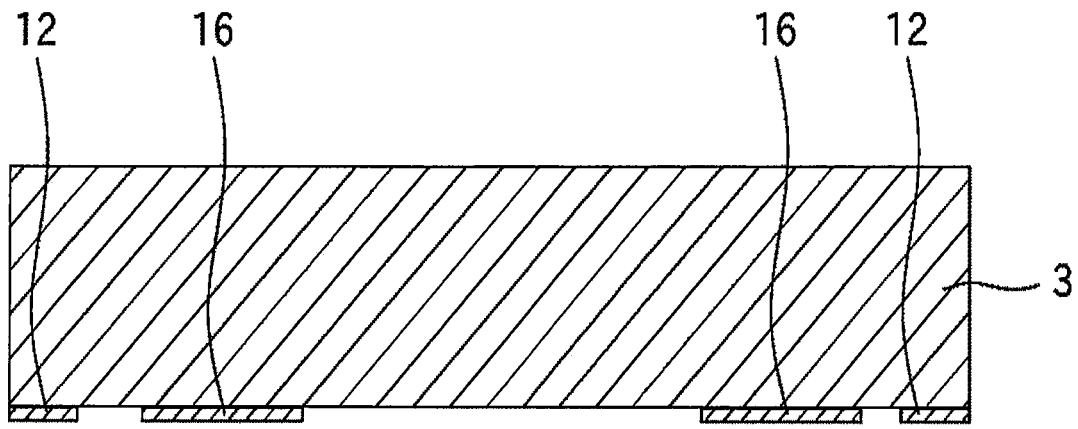
FIG. 7 is a cross-sectional view showing a step of processing a cap substrate used for a semiconductor device according to a first embodiment.

The processing on the cap substrate 3 will be described along FIG. 7. FIG. 7 shows an A-A cross-section in FIG. 3. First, the bonding pads 12 and the electrode pads 16 are formed as shown in FIG. 7A. As a forming method may be used a method of forming them by vapor deposition lift-off after resist patterning, a method of forming them on the whole surface by a metal sputtering method, performing resist patterning, and removing an unnecessary portion by an ion milling method or the like. As for the configuration of the metals, for example, it is assumed that Au is formed by 500 nm after Ti is formed by 50 nm. Ti is used to ensure adhesiveness to the cap substrate 3 and barrier property, and Au is used to ensure adhesiveness to the sealing frame 18 and the bumps 19. Since a case where Au or AuSn is used as the materials of the sealing frame 18 and the bumps 19 will be described hereinto, the surfaces of the bonding pads 12 and the electrode pads 16 are also made of Au. However, when another metal is used as the materials of the sealing frame 18 and the bumps 19, it is necessary to select the metal materials on the outermost surfaces of the bonding pads 12 and the electrode pads 16 according to the other metal.

Figure 7B:
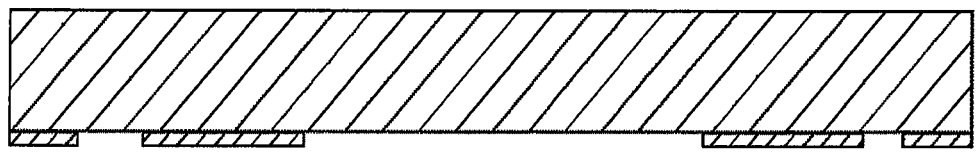

Next, the cap substrate 3 is thinned by grinding the upper surface side of the cap substrate 3 as shown in FIG. 7B. After grinding the cap substrate 3, a damaged layer is removed by polishing. The thickness of the cap substrate 3 is set to, for example, about 100 μm.

Figure 7C:
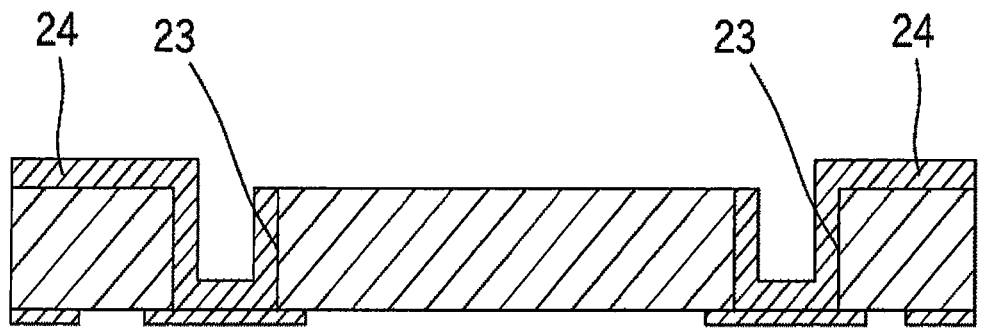

Next, the vias 23 and the electrodes 24 are formed as shown in FIG. 7C. Resist patterning is performed on the thinned surface of the cap substrate 3, and the vias 23 are formed by wet or dry etching. The patterning may be performed on a metal material such as Ni or the like in place of the resist because there is no processing selection ratio with the resist depending on the material of the cap substrate 3. Then, Ti and Au are successively formed on the upper surface of the cap substrate 3 by sputtering, and then Au is further plated by about several micrometers by electroplating to form the electrodes 24.

The processing on the cap substrate 3 is thus completed.

After the substrate 2 and the cap substrate 3 on which the processing has been completed are aligned with each other, and bonded to each other by increasing the temperature and pressurizing. As shown here, in a case where the sealing frame 18 and the bumps 19 which are made of Au are bonded to the bonding pads 12 and the electrode pads 16, when the bonded surfaces thereof are irradiated with Ar plasma to scrape the surfaces, and bonded to each other while activated, they are set to be bonded to each other while the interface between the Au portions thereof disappears. The bonded state is more excellent as the flatness of the bonded surface is higher, the temperature at the bonding time is higher, and the pressure at the bonding time is higher, and for example, it is preferable that the flatness is set to Ra=2 to 3 nm, the temperature is set to 300° C., and the pressure is set to 100 MPa or the like.

The substrate 2 and the cap substrate 3 thus bonded are diced to complete the semiconductor device 1 having the hollow portion 10.

Figure 8A:
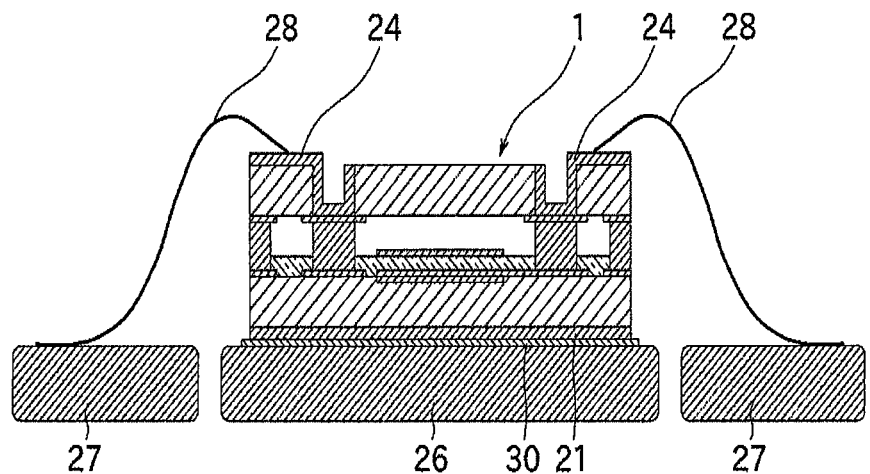
FIG. 8 is a cross-sectional view showing a step of packaging a semiconductor device according to a first embodiment.

Further, a method of sealing the semiconductor device 1 with the mold resin 29 will be described along FIG. 8. First, the semiconductor device 1 is die-bonded onto the base 26 made of CuW or the like as shown in FIG. 8A. Then, the electrode 24 and the lead 27 are wired to each other by the wire 28. It is preferable that a material having excellent heat resistance and heat dissipation property is selected as the die-bonding material 30, and it is preferable to use AuSn solder and further sintered Ag having high heat dissipation property.

Figure 8B:
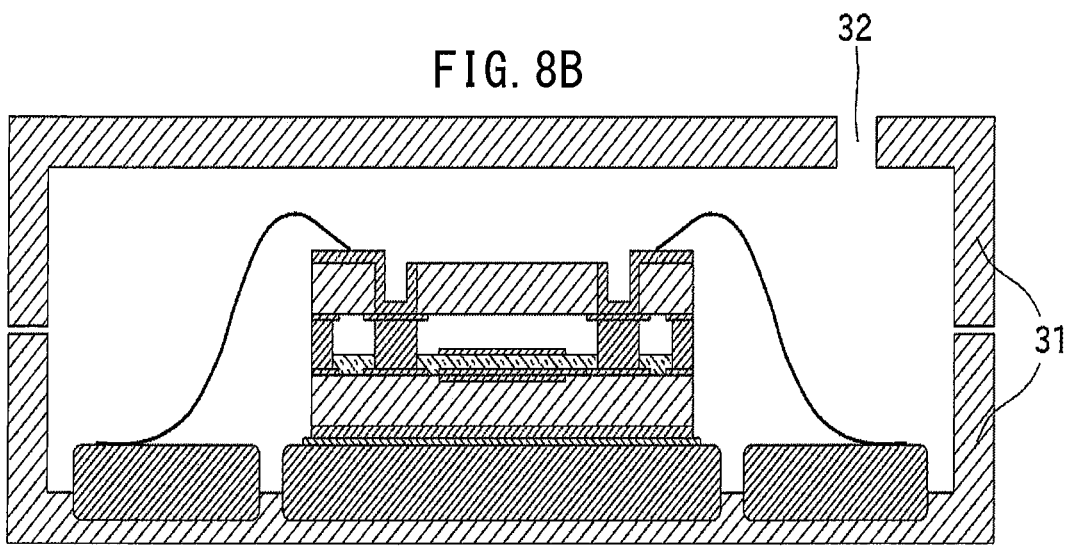

Next, as shown in FIG. 8B, the die-bonded semiconductor device 1 is set in a mold 31, and the mold resin 29 is poured into the mold 31 from a mold resin injection port 32. By pouring the mold resin 29 under high pressure, the mold resin 29 can be injected into between the semiconductor device 1 and the mold 31 without any gap, and molding can be stabilized.

Figure 8C:
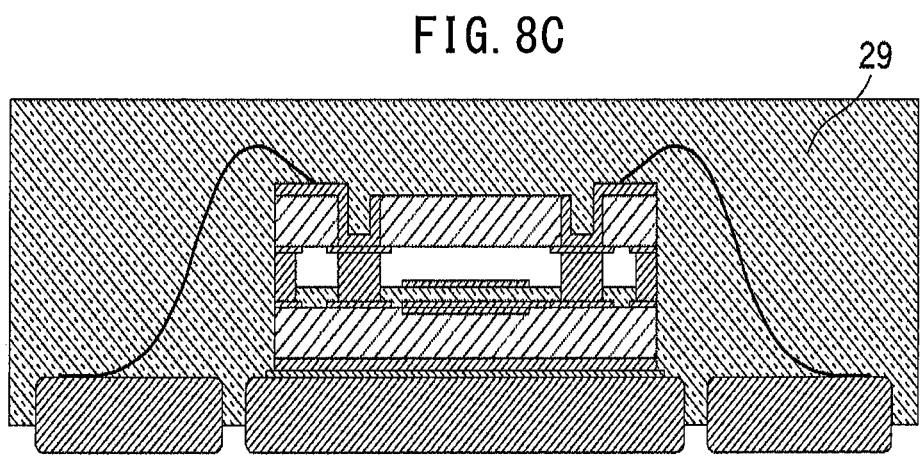

Finally, the mold 31 is removed as shown in FIG. 8C, and the sealing with the mold resin 29 is completed.

[Effect]

An effect of the invention applied to the semiconductor device 1 of the first embodiment will be described. The hollow portion 10 thermally insulates the heat generating portion 4 from the cap substrate 3 and the mold resin 29. Therefore, the hollow portion 10 has a role of preventing transmission of the heat from the heat generating portion 4 to the mold resin 29, and suppresses increase of the temperature of the mold resin 29. However, as described above, when the amount of heat generated from the heat generating portion 4 is equal to about 100 W, the temperature of the heat generating portion 4 reaches 100 to 300° C. Infrared rays radiated from the heat generating portion 4 whose temperature has reached 100 to 300° C. are absorbed by the cap substrate 3 and the mold resin 29, which causes increase of the temperature of the mold resin 29.

Here, a simulation will be described which confirms that the temperature increase of the mold resin 29 can be suppressed by providing the hollow portion 10. A structure having no hollow portion and a structure having a hollow portion are used as models for the simulation.

Figure 9:
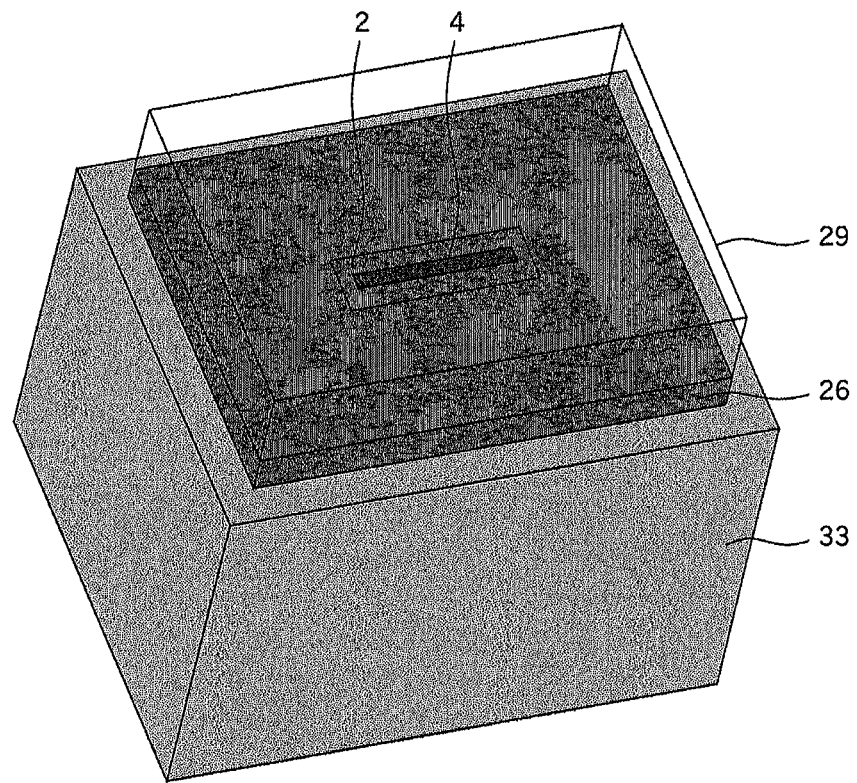
FIG. 9 is a perspective view showing a structure having no hollow portion used for the simulation.
Figure 10:
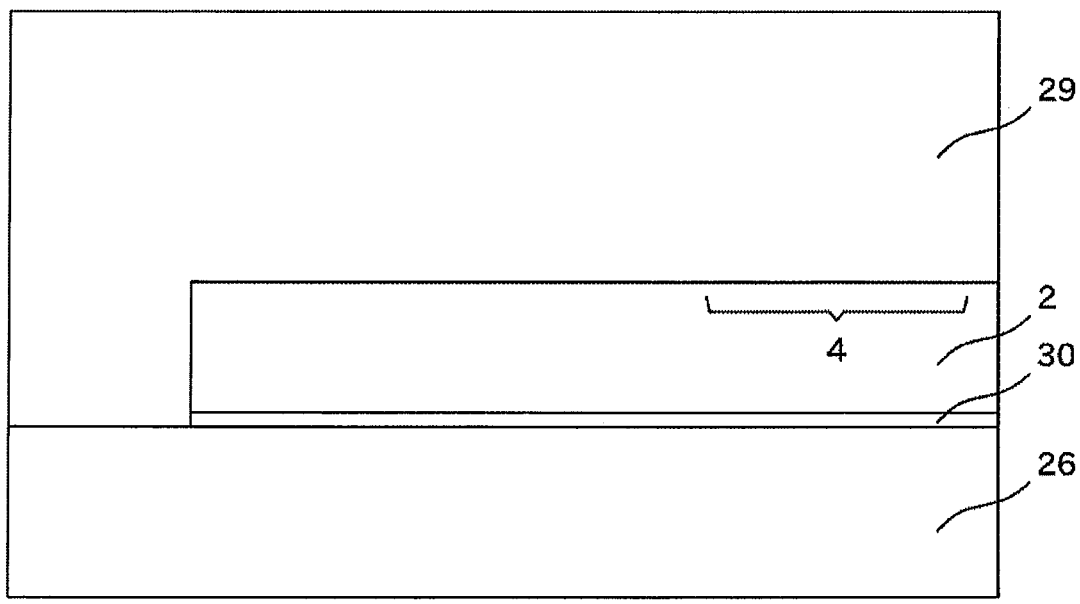
FIG. 10 is a cross-sectional view showing a structure having no hollow portion used for the simulation.

The structure having the hollow portion used for the simulation will be described. FIG. 9 is a perspective view of the structure having no hollow portion, and FIG. 10 is a cross-sectional view of the structure having no hollow portion. In the structure having no hollow portion, a CuW base 26 having a thickness of 1 mm is arranged on an aluminum block 33 fixed at 85° C. An SiC substrate 2 having a thickness of 100 μm is die-bonded onto the base 26 with an AuSn die-bonding material 30 having a thickness of 10 μm. A GaN HEMT is formed on the substrate 2, and the channel of the HEMT serves as the heat generating portion 4. It is assumed that the thickness of a layer in which the HEMT is formed is small, an epitaxial layer which would originally have been formed on the substrate 2 is omitted, and the heat generating portion 4 is formed on a part of the upper surface of the substrate 2. In the HEMT, the gate width is set to 50.4 mm, the number of gate fingers is set to 120, and the calorific value during operation is set to 97 W. The upper portions of the base 26 and the substrate 2 are covered with the mold resin 29.

Figure 11:
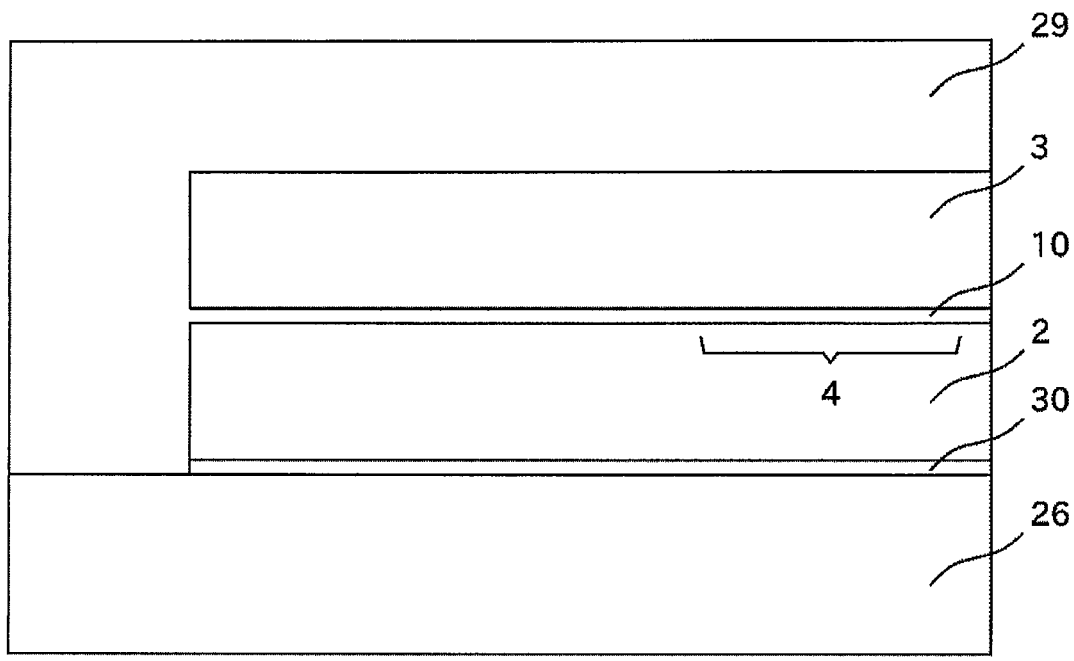
FIG. 11 is a cross-sectional view showing a structure having a hollow portion used for the simulation.

The structure having the hollow portion used for the simulation will be described. FIG. 11 is a cross-sectional view of the structure having the hollow portion. In this structure, an Si cap substrate 3 having a thickness of 100 μm is formed on an upper side of the substrate 2 with the hollow portion 10 having a thickness of 10 μm interposed therebetween. It is assumed that the hollow portion 10 is filled with nitrogen. The other conditions are the same as the structure having no hollow portion.

As a result of carrying out the simulation, the maximum temperature of the mold resin is equal to 187.97° C. for the structure having no hollow portion and 143.00° C. for the structure having the hollow portion, and it is found that the maximum temperature of the mold resin is significantly lower in the structure having the hollow portion. However, there is no margin for 150° C. which is the heat resisting temperature of general mold resin. Therefore, a further countermeasure for suppressing the temperature increase of the mold resin is needed. An effect of introducing the reflection film which is the countermeasure will be described below.

When the reflection film 9 is provided as in the case of the semiconductor device 1 of the first embodiment, infrared rays radiated from the heat generating portion 4 are reflected, and thus the rate at which the infrared rays are absorbed by the cap substrate 3 and the mold resin 29 decreases, so that the temperature increase of the mold resin 29 is further suppressed.

Figure 12:
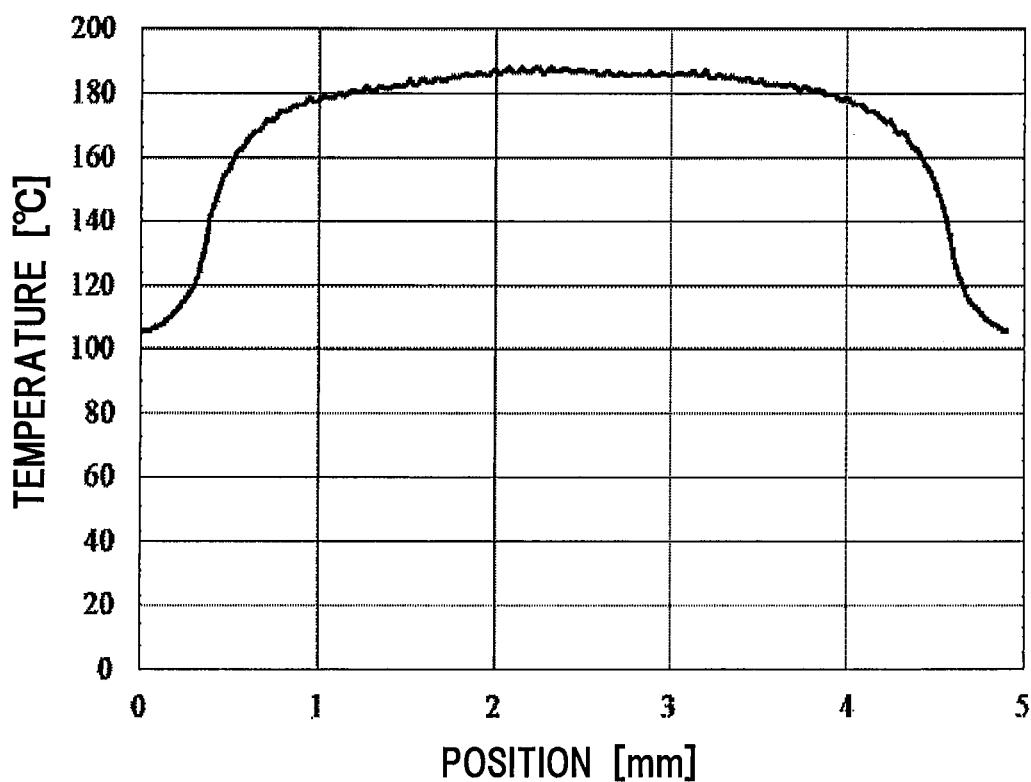
FIG. 12 is a graph showing a temperature distribution of a heat generating portion in a structure having a hollow portion.

Normally, the temperature of the heat generating portion 4 is highest in the vicinity of the center thereof, and the temperature becomes lower as shifting to the periphery thereof. According to Stephen Boltzmann's law, the radiant energy from the blackbody is proportional to the fourth power of the absolute temperature (K). When it is assumed that the radiant energy from the heat generating portion 4 is also approximately proportional to the fourth power of the absolute temperature, it is understood that the radiant energy from the vicinity of the center is largest, and the radiant energy becomes smaller as shifting to the periphery. Accordingly, it is desirable that the reflection film 9 is arranged so as to cover the center of the heat generating portion 4 in plan view. FIG. 12 shows a result obtained by calculating the temperature distribution of the heat generating portion 4 in the structure having the hollow portion by simulation. As can be seen from this figure, a high-temperature region of the heat generating portion 4 is a region having a length of about 80% of the center of the heat generating portion 4. When the length is converted to a plane, the high-temperature region is a region having an area of about 80%× 80%=64%. That is, it is desirable that the reflection film 9 is arranged so as to cover at least the area of about 60% of the central portion of the heat generating portion 4 in plan view. Furthermore, it is desirable that at least the entire surface of the heat generating portion 4 is covered.

In addition, since it is desirable that the reflection film 9 efficiently reflects infrared rays, the reflectance of the reflection film 9 is preferably higher. Further, assuming that there is no transmission, the relationship between reflectance and absorptance is represented as follows.

Reflectance=1−absorptance

Furthermore, from Kirchhoff's law on radiation,

Absorptance=emissivity

That is,

Reflectance=1−emissivity

Since the temperature of the reflection film 9 also increases due to thermal conduction from the heat generating portion 4, when a material having high emissivity is used for the reflection film 9, the energy of infrared-ray radiation from the reflection film 9 increases, so that the temperature increase of the mold resin 29 occurs. Accordingly, in order to suppress this temperature increase, the emissivity of the reflection film 9 may be reduced. That is, the reflectance of the reflection film 9 may be increased. Therefore, it is desirable that the reflectance in the medium wavelength infrared-ray region is equal to 0.9 or more. Metal having high reflectance to medium wavelength infrared rays and low transmittance and absorptance or the like is suitable as the material of the reflection film 9. Specifically, Al, brass, Cu, Au, Ni, Pt, Ag, Zn, Pd, or the like is suitable. A multilayer film including a substance layer having high reflectance may be used as the reflection film 9.

When infrared rays are incident to metal, the infrared rays scarcely reach a portion at a depth of 0.03 μm or more from the surface of the metal. Therefore, when metal is used as the material of the reflection film 9, it is preferable to set the thickness thereof to 0.03 μm or more.

Although it is desirable that both the upper surface and the lower surface (the adhesive surface to an insulating film) of the reflection film 9 have high reflectance, an effect can be obtained even when the reflectance of only one of the surfaces is high. For example, in the case where the reflectance of only the lower surface is high, the infrared rays radiated from the heat generating portion 4 is reflected, so that the temperature increase of the mold resin 29 can be suppressed. Furthermore, in the case where the reflectance of only the upper surface is high, the energy of infrared-ray radiation from the upper surface of the reflection film 9 is suppressed even when the temperature of the upper surface of the reflection film 9 increases, so that the temperature increase of the mold resin 29 can be suppressed. A situation in which only either the upper surface or the lower surface of the reflection film has high reflectance is realized in such a case that only one of the surfaces of the reflection film is oxidized and a layer is formed.

The reflectance also depends on the surface condition of the lower surface of the reflection film 9, and it is desirable that this surface is a surface having a surface roughness (Ra) ranging from several nm to several tens nm or less which is called a glossy surface, a mirror surface, a polished surface, or the like. Conversely, since the reflectance decreases as the surface is rougher, for the purpose of preventing the surface from being oxidized, the lower surface of the reflection film 9 may be coated with an insulating film (SiO or the like) through which the medium wavelength infrared rays are likely to transmit.

Furthermore, the hollow portion 10 may be filled with, for example, dry air such as nitrogen, but it is better to set the hollow portion 10 to a vacuum state. Since the thermal conductivity of nitrogen is equal to about 0.024 W/m·K and the thermal conductivity of Si of semiconductor is equal to about 168 W/m·K, the thermal conductivity of nitrogen is lower than that of Si by about four orders in magnitude. In the vacuum state, the thermal conductivity is further lower, and the thermal conduction from the heat generating portion 4 to the mold resin 29 is further reduced.

It is desirable that the material of the substrate 2 is a material having high thermal conductivity. Since a heat dissipation path from the heat generating portion is a path passing from the back surface of the substrate 2 through the die-bonding material 30 and reaching the base 26, the heat dissipation efficiency is higher as the thermal conductivity of the substrate 2 is higher. Among semiconductor substrates, the SiC substrate has high thermal conductivity and is suitable as the material.

It is desirable that the thermal conductivity of the cap substrate 3 is lower than that of the substrate 2. A part of heat generated in the heat generating portion 4 reaches the cap substrate 3 by heat conduction and radiation. However, since the thermal conductivity of the cap substrate 3 is lower than that of the substrate 2, a large amount of the heat generated in the heat generating portion 4 can be selectively released from the substrate 2 to the base 26, so that the temperature increase of the mold resin 29 is suppressed.

Second Embodiment

A semiconductor device according to a second embodiment will be described. A main difference between the semiconductor device of the second embodiment and the semiconductor device of the first embodiment resides in a place where the reflection film is formed. The difference will be mainly described hereinto.

Figure 13:
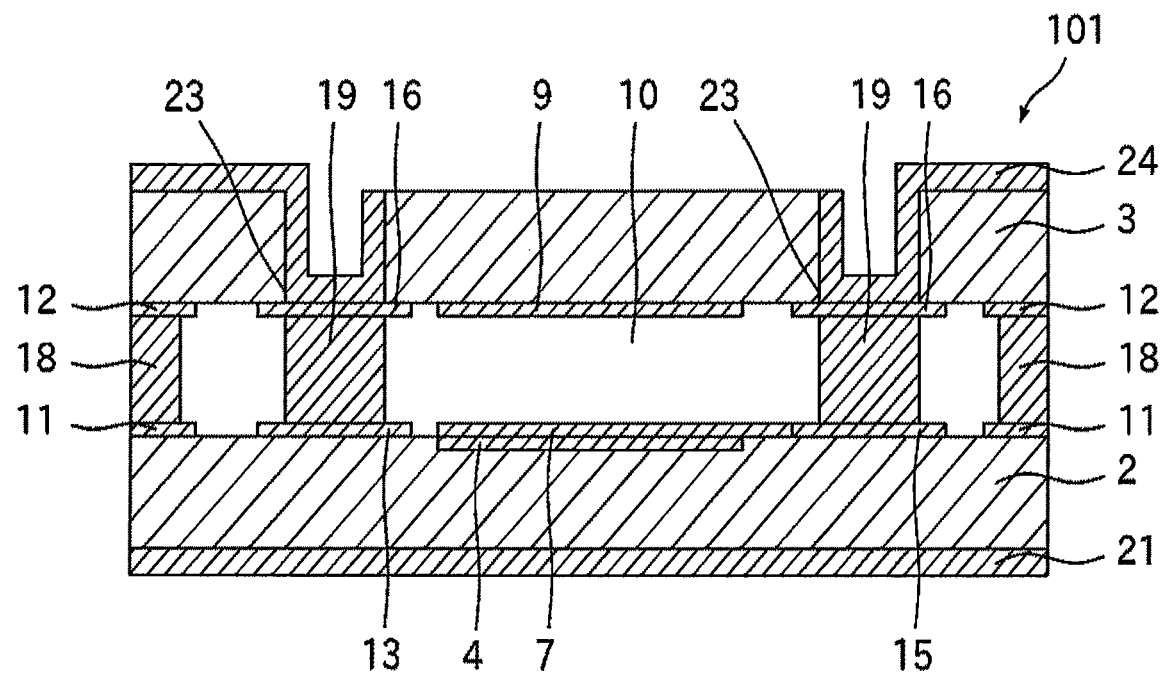
FIG. 13 is a cross-sectional view showing a semiconductor device according to a second embodiment.

FIG. 13 is a cross-sectional view of a semiconductor device 101. The reflection film 9 is formed on a surface of the cap substrate 3 which faces the substrate 2. Therefore, as described with respect to the first embodiment, the reflection film 9 prevents infrared rays radiated from the heat generating portion 4 from reaching the cap substrate 3 and the mold resin 29, so that the temperature increase of the mold resin 29 is suppressed. In this case, the insulating film 8 of the first embodiment is omitted, but the insulating film may be provided.

The reflection film 9 may be a laminate film of two or more layers containing a substance layer having high reflectance, and only a layer closest to the substrate 2 may have a reflecting function. For example, the reflection film 9 may have a two-layer structure in which Ti having high adhesiveness to the cap substrate 3 is used as the material of a layer adhering to the cap substrate 3, and Au having both high adhesiveness to Ti and high reflectance to infrared rays is used as the material of a layer close to the substrate 2.

Third Embodiment

A semiconductor device according to a third embodiment will be described. A main difference between the semiconductor device according to the third embodiment and the semiconductor device according to the first embodiment resides in a place where the reflection film is formed. The difference will be mainly described hereinto.

Figure 14:
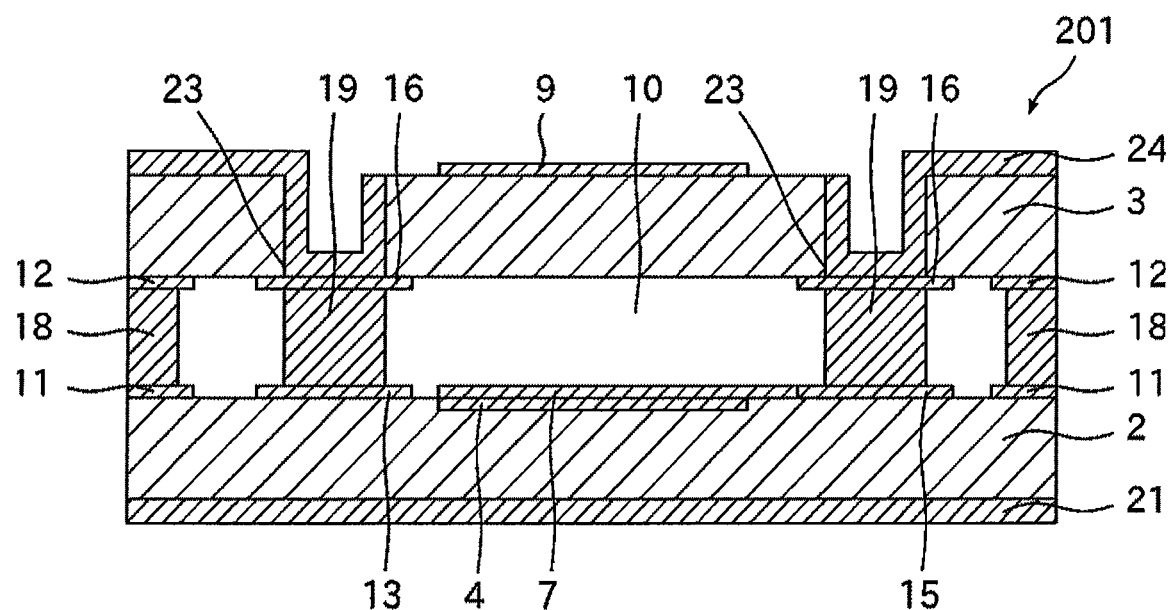
FIG. 14 is a cross-sectional view showing a semiconductor device according to a third embodiment.

FIG. 14 is a cross-sectional view of a semiconductor device 201. The reflection film 9 is formed on an opposite surface of the cap substrate 3 to the surface facing the substrate 2. Therefore, as described with respect to the first embodiment, the reflection film 9 prevents infrared rays radiated from the heat generating portion 4 from reaching the mold resin 29, so that the temperature increase of the mold resin 29 is suppressed. The insulating film 8 of the first embodiment is omitted hereinto, but the insulating film may be provided.

Since the cap substrate 3 is made of Si, it less absorbs infrared rays, and transmits most of infrared rays radiated from the heat generating portion 4. Therefore, most of the infrared rays from the heat generating portion 4 reach the reflection film 9, and are reflected to the substrate 2 side. As described above, it is desirable that the cap substrate 3 has low infrared absorptance, and in addition to Si, SiC, GaAs, Si, SiGe, GaN, InP or the like may be used as the material.

Furthermore, the reflection film 9 may be a laminate film of two or more layers containing a substance layer having high reflectance, and only a layer farthest from the substrate 2 may have a reflecting function. For example, the reflection film 9 may have a two-layer structure in which Ti having high adhesiveness to the cap substrate 3 is used as the material of a layer adhering to the cap substrate 3, and Au having both high adhesiveness to Ti and high reflectance to infrared rays is used as the material of a layer far from the substrate 2.

[Regarding First to Third Embodiments]

Each of the inventions applied to the first to third embodiments may be used alone as described above, but these inventions may be used in combination.

REFERENCE SIGNS LIST

1,101,201 semiconductor device; 2 substrate; 3 cap substrate; 4 heat generating portion; 5 gate electrode; 6 source electrode; 7 drain electrode; 8 insulating film; 9 reflection film; 10 hollow portion; 11,12 bonding pad; 13,14,15,16 electrode pad; 18 sealing frame; 19 bump; 21 back surface electrode; 22,23 via; 24 electrode; 25 sealing material; 26 base; 27 lead; 28 wire; 29 mold resin; 30 die-bonding material; 31 mold; 32 mold resin injection port; 33 aluminum block

The invention claimed is:

1. A semiconductor device comprising:
a substrate;
a heat generating portion provided on the substrate;
a cap substrate provided above the substrate so that a hollow portion is provided between the substrate and the cap substrate;
mold resin covering at least the cap substrate; and
a reflection film provided above the heat generating portion and reflecting a medium wavelength infrared ray.

2. The semiconductor device according to claim 1, comprising an insulating film provided on the substrate and covering the heat generating portion,
wherein the hollow portion is provided between the insulating film and the cap substrate, and
the reflection film is provided on the insulating film.

3. The semiconductor device according to claim 1, wherein the reflection film covers at least an area of 60% of a central portion of the heat generating portion in plan view.

4. The semiconductor device according to claim 3, wherein the reflection film covers at least an entire surface of the heat generating portion in plan view.

5. The semiconductor device according to claim 1, wherein a reflectance of the reflection film to the medium wavelength infrared ray is equal to 0.9 or more.

6. The semiconductor device according to claim 5, wherein a reflectance of the reflection film to an infrared ray having wavelength range from 5.1 to 7.8 μm is equal to 0.9 or more.

7. The semiconductor device according to claim 1, wherein the reflection film includes a layer made of metal.

8. The semiconductor device according to claim 7, wherein the reflection film includes a layer made of any one of Al, brass, Cu, Au, Ni, Pt, Ag, Zn, and Pd.

9. The semiconductor device according to claim 1, wherein the hollow portion is set to a vacuum state.

10. The semiconductor device according to claim 1, wherein thermal conductivity of the cap substrate is lower than thermal conductivity of the substrate.

11. The semiconductor device according to claim 1, wherein the substrate is made of SiC.

12. The semiconductor device according to claim 1, wherein the mold resin extends past at least one side of the cap substrate.

13. A semiconductor device comprising:
a substrate;
a heat generating portion provided on the substrate;
a cap substrate provided above the substrate so that a hollow portion is provided between the substrate and the cap substrate; and
a reflection film provided above the heat generating portion and reflecting a medium wavelength infrared ray,
wherein the reflection film is provided on a surface of the cap substrate which faces the substrate.

14. A semiconductor device comprising:
a substrate;
a heat generating portion provided on the substrate;
a cap substrate provided above the substrate so that a hollow portion is provided between the substrate and the cap substrate; and
a reflection film provided above the heat generating portion and reflecting a medium wavelength infrared ray,
wherein the reflection film is provided on an opposite surface of the cap substrate to a surface facing the substrate.

15. The semiconductor device according to claim 13, wherein the reflection film is provided directly on a surface of the cap substrate which faces the substrate.

16. The semiconductor device according to claim 14, wherein the reflection film is provided directly on an opposite surface of the cap substrate to a surface facing the substrate.

* * * * *